United States Patent
Savransky et al.

(10) Patent No.: US 7,965,545 B2
(45) Date of Patent: Jun. 21, 2011

(54) REDUCING TEMPORAL CHANGES IN PHASE CHANGE MEMORIES

(75) Inventors: Semyon D. Savransky, Newark, CA (US); Ilya V. Karpov, Santa Clara, CA (US)

(73) Assignee: Intel Corporation, Santa Clara, CA (US)

(*) Notice: Subject to any disclaimer, the term of this patent is extended or adjusted under 35 U.S.C. 154(b) by 540 days.

(21) Appl. No.: 12/080,021

(22) Filed: Mar. 31, 2008

(65) Prior Publication Data

US 2009/0244964 A1 Oct. 1, 2009

(51) Int. Cl.
*G11C 11/00* (2006.01)

(52) U.S. Cl. .......... 365/163; 365/148; 977/754
(58) Field of Classification Search .......... 365/46, 365/94, 100, 113, 129, 148, 163; 257/2–5, 257/9, 296, E31.047, E27.006; 438/29, 95, 438/96, 166, 259, 365, 482, 486, 597; 977/754
See application file for complete search history.

(56) References Cited

U.S. PATENT DOCUMENTS 5,534,712 A * 7/1996 Ovshinsky et al. .......... 257/3
* cited by examiner

*Primary Examiner* — Richard Elms
*Assistant Examiner* — Harry W Byrne
(74) *Attorney, Agent, or Firm* — Trop, Pruner & Hu, P.C.

(57) ABSTRACT

A phase change memory in the reset state may be heated to reduce or eliminate electrical drift.

13 Claims, 3 Drawing Sheets

REDUCING TEMPORAL CHANGES IN PHASE CHANGE MEMORIES

BACKGROUND

This relates generally to phase change memories.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

DETAILED DESCRIPTION

In a phase change memory, the amorphous state is sometimes referred to as the reset state and the crystalline state is sometimes referred to as the set state. In the reset state, phase change memories may exhibit what may be described as temporal change or electrical drift of certain physical characteristics. Particularly, the reset resistance and/or threshold voltage may change over time. This makes reliable detection of the phase or state of the memory challenging.

By providing an anneal after applying a programming current pulse, greater stability can be achieved and the tendency to drift may be reduced or eliminated. An anneal pulse is generally of a current that produces, in a phase change material, a temperature less than the melt temperature of the phase change material. Without being bound by theory, it is believed that the anneal pulse provides for glass stabilization. In addition, the trailing edge of the programming pulse may be made relatively abrupt as well.

Figure 1:
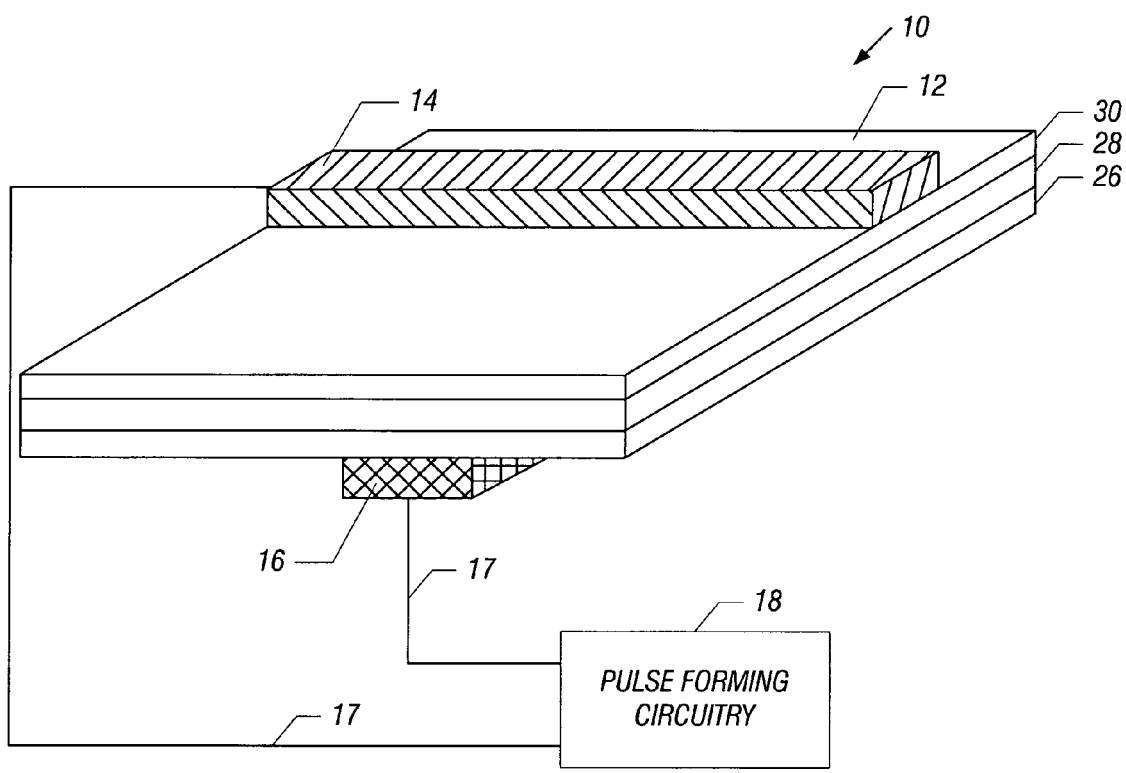
FIG. 1 is a schematic depiction of a phase change memory in accordance with one embodiment.

Thus, referring to FIG. 1, a phase change memory 10 includes upper electrodes 14 and lower electrodes 16. The memory 10 may be part of an array of ovonic unified memory or multilevel cell memory. In one embodiment, the electrodes 14 and 16 may be elongate and the electrodes 14 may extend generally transversely to the electrodes 16.

The phase change memory core 12 may be made up of a layer of phase changing chalcogenide material 26 and a layer of amorphous chalcogenide material 30 that remains in the amorphous phase. The amorphous chalcogenide material 30 is for the ovonic threshold switch. Electrodes 28 may be provided between the amorphous material 30 and the phase changing chalcogenide 26, in some embodiments.

Pulse forming circuitry 18 may provide shaped pulses for reading and programming the phase change memory via lines 17. The circuitry 18 may also be responsible for addressing particular cells of a memory array. In one embodiment, the circuitry 18 generates current pulses for programming an ovonic unified memory.

Figure 2:
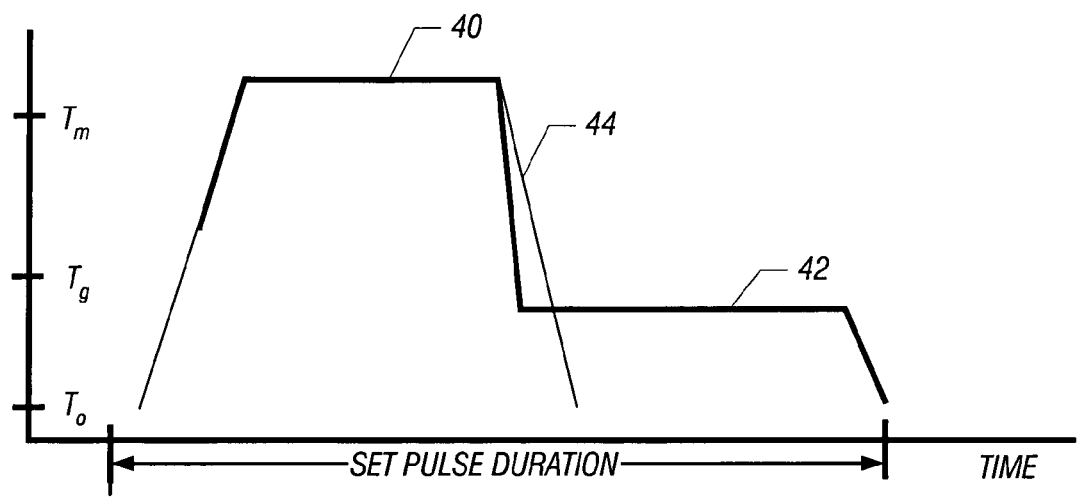
FIG. 2 is a graph of temperature versus time for one embodiment of the present invention.

Referring to FIG. 2, a reset programming pulse 40 is overlaid over a conventional reset programming pulse 44. The leading edge of the pulse 40 corresponds to the conventional pulse, as does the upper plateau. However, the trailing edge may be more abrupt in some embodiments.

The programming pulse 40 may be followed immediately by an anneal pulse 42. The anneal pulse 42 results in chalcogenide heating to a temperature that is lower than the glass transition temperature ($T_g$) of the chalcogenide. For example, for $Ge_2Sb_2Te_5$ the glass transition temperature is about 100° C. In the graph of FIG. 2, $T_O$ is the ambient temperature and $T_m$ is the temperature that causes chalcogenide melting. Note that the programming pulse 40 generates a temperature that exceeds $T_m$, while the anneal pulse does not generate a temperature in excess of $T_g$.

It is not necessary to melt the entire phase change memory material, but only a volume of actively phase changing material. The faster trailing edge of the programming pulse may be responsible for quenching the melt fast enough to prevent crystallization in some embodiments. For example, in some embodiments, the trailing edge may be less than one microsecond, for example, about three nanoseconds.

As a result of the anneal pulse 42, the chalcogenide material is heated to an elevated temperature to anneal the reset state to a stable glassy condition. The amplitude of the anneal pulse is less than the amplitude of the programming pulse to ensure that the array is not heated for too long of a time above the crystallization temperature and to avoid disturb or loss of the reset state. The duration of the anneal pulse 42, in some embodiments, may be from about five nanoseconds to ten microseconds, depending on amplitude.

Figure 3:
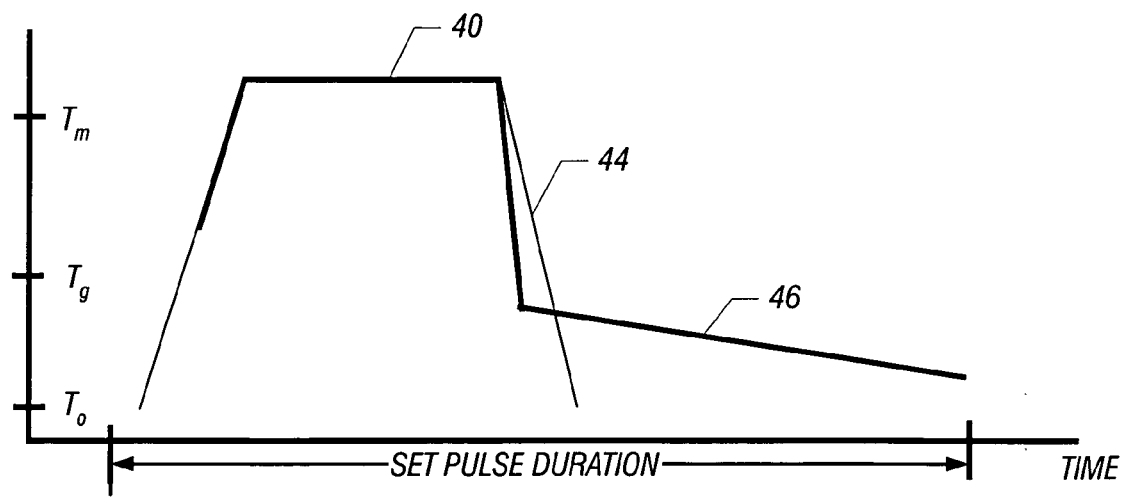
FIG. 3 is a graph of temperature versus time for another embodiment of the present invention.

Referring to FIG. 3, in accordance with another embodiment, instead of using a stair step application of programming and anneal pulses, an inclined ramp anneal pulse 46 may be used after the programming pulse 40. The anneal pulse 46 may have a duration of five nanoseconds to ten microseconds, in some embodiments, depending on amplitude.

Figure 4:
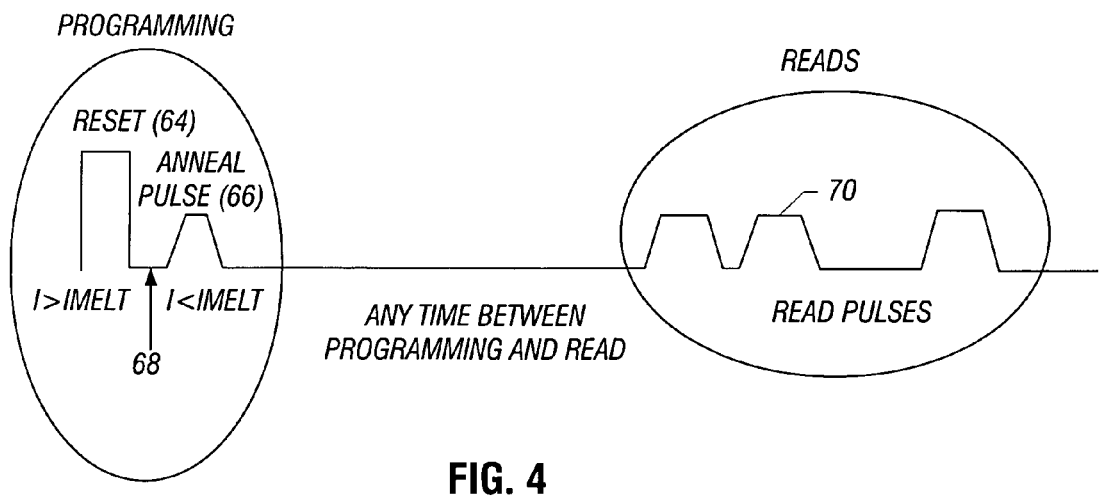
FIG. 4 is a graph of current versus time for another embodiment of the present invention.

Referring to FIG. 4, in accordance with still another embodiment, a reset programming pulse 64 may be relatively square. It may achieve a temperature greater than the melting temperature. It is then followed by a time period 68 of substantially zero current. This time period 68 may be up to about ten microseconds, in some embodiments.

Thereafter, an anneal pulse 66 is applied. The anneal pulse 66 may have a ramp up and a ramp down period, but its amplitude is low enough to result in a temperature less than the melt temperature and less than the glass transition temperature of the phase change memory alloy that is utilized.

In some embodiments, the time period 68 may be between one nanosecond and ten microseconds. The pulse 66 may threshold the device to provide enough current through the glassy material to anneal it without disturbing the reset state. Thereafter, read pulses 70 may follow at any time.

In each of the embodiments of FIGS. 2-4, a discontinuity in the temperature versus time graph is introduced after programming to the reset state. The discontinuity is indicated at A in each Figure. The discontinuity is applied at a temperature below the glass transition temperature. The ensuing thermal treatment below the glass transition temperature may be done for sufficient time to stabilize the glassy state and to eliminate electrical drift in some embodiments. The anneal pulse may have a duration of more than five nanoseconds in some embodiments.

In each of the embodiments, the anneal may accelerate structural relaxation of the glassy reset state that is responsible for drift of parameters. Saturation of glassy relaxation may lead to reduced drift. The anneal step may reduce or eliminate drift of reset parameters, such as the reset resistance and threshold voltage. In some embodiments, zero drift may be achieved by the appropriate selection of the amplitude of the anneal pulse and annealing period.

Programming to alter the state or phase of the material may be accomplished by applying voltage potentials to the electrodes 14 and 16, thereby generating a voltage potential across a memory element including a phase change material 26. When the voltage potential is greater than the threshold voltages of any select device and memory element, then an electrical current may flow through the phase change material 26 in response to the applied voltage potentials, and may result in heating of the phase change material 26.

This heating may alter the memory state or phase of the material 26, in one embodiment. Altering the phase or state of the material 26 may alter the electrical characteristic of memory material, e.g., the resistance of the material may be altered by altering the phase of the memory material. Memory material may also be referred to as a programmable resistive material.

In the "reset" state, memory material may be in an amorphous or semi-amorphous state and in the "set" state, memory material may be in an a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to melt and then vitrify memory material and "reset" memory material in an amorphous state (e.g., program memory material to a logic "0" value). Heating the volume of memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

One or more MOS or bipolar transistors or one or more diodes (either MOS or bipolar) may be used as the select device. If a diode is used, the bit may be selected by lowering the row line from a higher deselect level. As a further non-limiting example, if an n-channel MOS transistor is used as a select device with its source, for example, at ground, the row line may be raised to select the memory element connected between the drain of the MOS transistor and the column line. When a single MOS or single bipolar transistor is used as the select device, a control voltage level may be used on a "row line" to turn the select device on and off to access the memory element.

An ovonic threshold switch is either on or off depending on the amount of voltage potential applied across the switch and, more particularly, whether the current through the switch exceeds its threshold current or voltage, which then triggers the device into an on state. The off state may be substantially electrically non-conductive and the on state may be a substantially conductive state with less resistance than the off state.

In the on state, the voltage across the switch, in one embodiment, is equal to its holding voltage $V_{hold}+IR_{on}$, where $R_{on}$ is the dynamic resistance from the extrapolated X axis intercept $V_{hold}$. For example, an ovonic threshold switch may have a threshold voltage $V_{th}$ and, if a voltage potential less than the threshold voltage of the switch is applied across the switch, then the switch may remain off or in a relatively high resistant state so that little or no electrical current passes.

Alternatively, if a voltage potential greater than the threshold voltage of the select device is applied across the device, then the device may turn on, i.e., operate in a relatively low resistance state so that significant electrical current passes through the switch. In other words, one or more series connected switches may be in a substantially electrically non-conductive state at less than a predetermined voltage, e.g., the threshold voltage as applied across a switch. The switch may be in a substantially conductive state if greater than a predetermined voltage is applied across the switch.

In one embodiment, each switch may comprise a switch material that is a chalcogenide alloy. The switch material may be a material in a substantial amorphous state positioned between two electrodes that may be repeatedly and reversibly switched between a higher resistance off state that is greater than about 10 megaohms and a relatively lower resistance on state that is about 10 Ohms in series with the holding voltage by the application of electrical current or potential.

Each switch is a two-terminal device that has an IV curve similar to that of a phase change memory element that is in an amorphous state. However, unlike a phase change memory element, the ovonic threshold switch does not change phase. That is, the switching material of the ovonic threshold switch is not a programmable material and, as a result, the switch may not be a memory device capable of storing information. For example, the switching material may remain permanently amorphous and the IV characteristics may remain the same throughout the operating life.

In the low voltage, a low electric field mode, where the voltage applied across the switch is less than the threshold voltage $V_{th}$, the switch may be off or non-conducting and exhibits a relatively high resistance (greater than about 10 megaOhms). The switch may remain in the off state until its sufficient voltage, namely, the threshold voltage, is applied or a sufficient current is applied, namely, the threshold current, that switches the device to a conductive relatively low resistance on state. After a voltage potential of greater than about the threshold voltage is applied across the device, the voltage potential across the device may drop or snapback to a holding voltage $V_{hold}$. Snapback may refer to the voltage difference between the threshold voltage and the holding voltage of the switch.

In the on state, the voltage potential across the switch may remain close to the holding voltage as current passing through the switch is increased. The switch may remain on until the current through the switch drops below a holding current. Below this value, the switch may turn off and return to a relatively high resistance, non-conductive off state, until the threshold voltage and current are again exceeded.

In some embodiments, only one switch may be used. In other embodiments, two or more series connected switches may be used.

Figure 5:
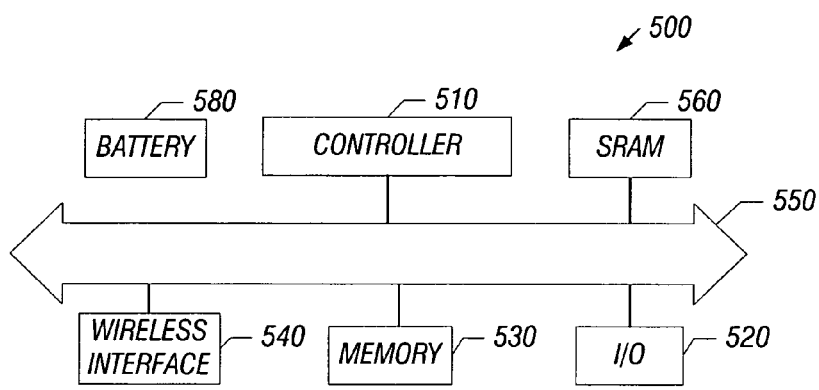
FIG. 5 is a system depiction for one embodiment of the present invention.

Turning to FIG. 5, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
applying a program pulse to program the reset state of a phase change material; and
providing an anneal pulse to the material, after the program pulse, to generate a temperature of less than the glass transition temperature of the phase change material.

2. The method of claim 1 wherein said program pulse generates a temperature in said material greater than the melting temperature of the material.

3. The method of claim 1 including providing a trailing edge on said program pulse having a duration less than one microsecond.

4. The method of claim 3 including providing said anneal pulse with a duration from about five nanoseconds to ten microseconds.

5. The method of claim 1 including providing said anneal pulse to follow immediately after said program pulse.

6. The method of claim 1 including providing a period of substantially no current between said program pulse and said anneal pulse.

7. The method of claim 6 including providing a period of substantially no current of less than ten microseconds.

8. The method of claim 1 including applying a square shaped anneal pulse.

9. The method of claim 1 including providing a downwardly ramped anneal pulse.

10. The method of claim 1 including applying a program pulse with a more abrupt trailing edge than leading edge.

11. The method of claim 1 including stabilizing a glassy reset state using said anneal pulse.

12. The method of claim 1 including providing an anneal pulse to eliminate electrical drift of the reset state.

13. The method of claim 1 including providing the anneal pulse for more than five nanoseconds.

* * * * *